US006828855B1

(12) United States Patent
Wang

(10) Patent No.: US 6,828,855 B1
(45) Date of Patent: Dec. 7, 2004

(54) CLASS AB OPERATIONAL AMPLIFIER WITH SPLIT FOLDED-CASCODE STRUCTURE AND METHOD

(75) Inventor: Binan Wang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 8 days.

(21) Appl. No.: 10/465,184

(22) Filed: Jun. 19, 2003

(51) Int. Cl.[7] .............................................. H03F 3/45
(52) U.S. Cl. .................... 330/253; 330/255; 330/257
(58) Field of Search ............................... 330/253, 255, 330/257

(56) References Cited

U.S. PATENT DOCUMENTS

| 5,294,892 A | * | 3/1994 | Ryat ............................ 330/253 |
| 5,471,172 A | * | 11/1995 | Chiu et al. ................... 330/253 |
| 6,154,092 A | * | 11/2000 | Lee et al. ...................... 330/51 |
| 6,556,081 B2 | * | 4/2003 | Muza ........................... 330/253 |

OTHER PUBLICATIONS

"Compact Low–Voltage Power–Efficient Operational Amplifer Cells for VLSI" by de Langen et al., IEEE Journal of Solid–State Circuits, vol. 33, No. 10, Oct. 1998, pp. 1482–1496.

"A CMOS Large–Swing Low–Distortion Three–Stage Class AB Power Amplifier" by Op't Eynde et al., IEEE Journal of Solid–State Circuits, vol. 25, No. 1, Feb. 1990, pp. 265–273.

* cited by examiner

Primary Examiner—Patricia Nguyen
(74) Attorney, Agent, or Firm—W. Daniel Swayze, Jr.; W. James Brady; Frederick J. Telecky, Jr.

(57) ABSTRACT

Bias current in output transistors of a class AB output stage is controlled by providing equal amplification to both an output of an input stage (2) of an amplifier and an output (17,18) of a class AB control circuit (46). A split input transistor circuit structure for a first side of the differential input stage (2) includes first (15) and second (16) input transistors with gates coupled to a first input (Vin+). A third input transistor (10) of the input stage has a gate coupled to a second input (Vin−). A split folded common gate cascode circuit includes first (25) and second (30) cascode transistors having their drains coupled to gates of the output transistors, respectively, and a third cascode transistor has a source coupled to a drain of the third input transistor. The bias current is sensed and compared with a reference current to produce an error signal that is amplified to produce a differential error current a signal which is introduced applied to sources of the first and second cascode transistors.

21 Claims, 6 Drawing Sheets

CLASS AB OPERATIONAL AMPLIFIER WITH SPLIT FOLDED-CASCODE STRUCTURE AND METHOD

BACKGROUND OF THE INVENTION

The present invention relates generally to class AB operational amplifiers, and more particularly to a class AB operational amplifier having a split folded-cascode structure.

In a typical "folded mesh" type of class AB amplifier structure, bias current in the output transistors is not well-controlled, especially when the structure is used in circuit designs that are not low-power, low voltage designs.

The article "Compact Low-Voltage Power-Efficient Operational Amplifier Cells for VLSI" by De Langen and Huijsing, (IEEE JSSC volume 33, No. 10, October 1988) describes a rail-to-rail operational amplifier including a class AB output stage having "folded mesh" feedback control circuitry. "Prior Art" FIG. 1 herein is taken from the foregoing article and shows a simplified schematic diagram for the described operational amplifier in which a circuit branch connected to the drain of the current mirror transistor M10 is "split" into above folded mesh circuitry, which includes transistors M13–16. (A conventional folded cascode structure would eliminate transistors M13 and M16.) The folded mesh circuitry produces differential output signals, one of which drives the gates of output transistor M1 and a corresponding output current sensing transistor M11. The other one of the differential output signals drives the gates of output transistor M2 and a corresponding current sensing transistor M12, which is used to provide class AB control feedback. The current in output transistor M1 is sensed by transistor M11 to provide a corresponding input signal to the class AB control circuit, and the current in output transistor M2 is sensed by transistor M12 to provide a corresponding input signal to the class AB control circuit.

The resulting output voltage VAB produced by the class AB control circuit is applied as a feedback loop control signal to the gate of cascode transistor M16. The voltage VAB is compared to the gate voltage of transistor M14, which is developed across transistor M18 by the flow of reference current I18 through diode-connected transistor M18. The quiescent output current through output transistors M1 and M2 is a design parameter that can be controlled by the choice of the value of reference current I18, the ratio of the channel-width-to-channel-length of current sensing transistor M11 to that of output transistor M1, and the ratio of the channel-width-to-channel-length of current sensing transistor 12 to that of output transistor M2.

The circuitry of prior art FIG. 1 works very well with low values of the supply voltage VDD, e.g. 2 volts. However, in situations in which a higher value of VDD is required, e.g. 5 volts, the circuit of FIG. 1 tends to produce inadequate control of the quiescent bias current through the output transistors M1 and M2. The inadequate bias current control is due to the fact that the differential class AB drive voltage signals produced by the folded mesh circuitry and applied to the gates of output transistors M1 and M2 can differ by as much as 3 volts at larger values of VDD. The folded mesh circuitry and class AB control a loop in of FIG. 1 is quite sensitive to VDD. For VDD equal to approximately 2 volts, the quiescent bias current in the output transistors is fairly controllable, but if VDD is increased to approximately 5 volts, the quiescent bias current in the output stage will increase substantially, which results in substantially increased power consumption of the operational amplifier.

The undesirable increase in the quiescent output bias current through output transistors M1 and M2 occurs because the difference between their gate voltages increase as the supply voltage VDD increases. In order to achieve precise control of the quiescent output bias current, the class AB control loop needs to the attenuate the foregoing gate voltage difference, which is referred to as the "systematic error". Unfortunately, the class AB loop gain for the circuit of FIG. 1 is relatively low. If the properties of the folded mesh cascode circuit structure including transistors M13–16 is examined, it can be seen that only the common mode signals in the folded mesh circuitry obtain the same benefit as the main amplifier signals from the cascode circuit. However the class AB control loop structure presents a differential feedback signal in the folded mesh circuitry, and each pair of cascode transistors is source-coupled and consequently loses the main benefit of using cascode transistors. The resulting lower impedance in the class AB control loop in turn results in a lower class AB loop gain, and this results in a reduced ability to the attenuate the above-mentioned systematic errors. The gain of the class AB control loop is poor, which causes poor control of, and consequently instability of, the quiescent bias current flowing through output transistors M1 and M2.

Thus, there is an unmet need for a class AB output stage that provides a highly controllable quiescent bias current in the output transistors at relatively high power supply voltages and at relatively low power supply voltages.

There also is an unmet need for a class AB output stage that provides a highly controllable quiescent bias current in the output transistors over a fairly broad range from relatively low power supply voltages to relatively high power supply voltages with no additional cost or complexity compared to that of a typical prior art folded mesh type of class AB output stage circuit.

There also is an unmet need for a class AB control feedback loop that more effectively attenuates a reduces the systematic error associated with the folded mesh circuitry of the closest prior art in order to accomplish accurate control of the quiescent bias current flowing through the output transistors of a class AB output stage.

SUMMARY OF THE INVENTION

Accordingly, it is an object of the present invention to provide a class AB output stage that provides a highly controllable quiescent bias current in the output transistors at relatively high power supply voltages and at relatively low power supply voltages.

It is another object of the present mentioned to provide a class AB output stage that provides a highly controllable quiescent bias current in the output transistors over a fairly broad range from relatively low power supply voltages to relatively high power supply voltages with no additional cost or complexity compared to that of a typical prior art folded mesh type of class AB output stage circuit.

It is another object of the present invention to provide a class AB control feedback loop that more effectively attenuates (reduces) the systematic error associated with the folded mesh circuitry of the closest prior art in order to accomplish accurate control of the quiescent bias current flowing through the output transistors of a class AB output stage.

Briefly described, and in accordance with one embodiment, the present invention provides circuitry for controlling quiescent bias current in output transistors of a class AB output stage is controlled by providing substantially equal amounts of differential amplification to both an output of a differential input stage (2) of an amplifier and an output (17,18) of a class AB control circuit (46) of the amplifier. A split input transistor circuit structure for a first side of the differential input stage (2) includes first (15) and second (16) input transistors with gates coupled to a first input (Vin+) of the amplifier. A third input transistor (10) of the input stage has a gate coupled to a second input (Vin−) of the amplifier. A split folded cascode circuit structure having a common gate configuration includes first (25) and second (30) cascode transistors having their gates coupled to a reference voltage and their drains coupled to the first (26) and second (37) gate drive conductors, respectively, and a third cascode transistor (22) has a gate connected to the reference voltage and a source coupled to a drain of the third input transistor.

In the described embodiments, a pull-up transistor (40) in the first class AB output stage (46) has a gate coupled to a first gate drive conductor (26) and a drain coupled to a first output conductor (42) and a pull-down transistor (41) in the first class AB output stage (46) having a gate coupled to a second gate drive conductor (37) and a drain coupled to the first output conductor (42). The bias current in the output transistors is sensed and compared with a reference current (53) by means of the class AB control circuit (46) to produce a differential error signal which is amplified to produce a differential error current signal which applied to the source of one of the first (25) and second (30) cascode transistors. In the described embodiments, the differential error signal is amplified to produce a differential error current signal which is introduced into the sources of the first and second gate-coupled cascode transistors. The common-gate cascode circuit structure and the error current signal applied to the sources of the first and second gate-coupled cascode transistors causes the drains of the first (25) and second (30) cascode transistors to present high output impedances to the first (26) and second (37) gate drive conductors, which results in high loop gain and consequently results in precise control of a first quiescent bias current in the first (40) and second (41) output transistors.

In the described embodiments, third (32) and forth (35) cascode transistors each has a gate coupled to another reference signal conductor (34), the third and fourth cascode transistors having drains coupled to the first (26) and second (37) gate drive conductors, respectively, and sources coupled to first (33) and second (36) current source devices, respectively. In the described embodiments, the first (15), second (16) and third (10) input transistors and the first output transistor (40) are P-channel transistors, and the second output transistor (41), the first (25) and second (30) cascode transistors, the first (27) and second (29) current source transistors, and the first current mirror control transistor (24) are N-channel transistors.

In the described embodiments, the first class AB control circuitry (46) includes differential amplifier circuitry including first (54), second (55) and third (56) source-coupled transistors, a reference current source (53), and a diode-connected reference voltage transistor (58) having a drain connected to receive a reference current from the reference current source, the first and second inputs of the first class AB control circuitry being connected to gates of the first (54) and second (55) source-coupled transistors, respectively, a gate of the third source-coupled transistor (56) being coupled to a gate of the diode-connected reference voltage transistor (58), a drain of the third source-coupled transistor (56) being coupled to the first conductor (17), and drains of the first (54) and second (55) source-coupled transistors being coupled to the first conductor (18).

In one embodiment, the differential input stage includes a fourth input transistor (11) having a source, a gate, and a drain connected to the source, gate, and a drain, respectively, of the third input transistor (10). The amplifier includes a second class AB output stage (4A) including a third output transistor (40A) having a gate coupled to a third gate drive conductor (26A) and a drain coupled to a second output conductor (42A) and a fourth output transistor (41A) having a gate coupled to a fourth gate drive conductor (37A) and a drain coupled to the second output conductor (42A). The operational amplifier also includes a second split folded cascode stage which is similar to the first split folded cascode stage and second class AB control circuitry which is similar to the first class AB control circuitry. The drains of third (25A) and fourth (30A) cascode transistors in the second split folded cascode stage present high output impedances to the third (26A) and fourth (37A) gate drive conductors resulting in high loop gain and consequently resulting in precise control of a quiescent bias current in third (40A) and fourth (41A) output transistors. A common mode feedback circuit (62) has a first input connected to the first output conductor (42), first and second outputs connected to the first (17) and second (18) conductors, respectively, to establish a common mode component on the first output conductor (42), a second input connected to the second output conductor (42A), and third and fourth outputs connected to third (17A) and fourth (18A) conductors, respectively, to establish the common mode component on the second output conductor (42A).

DETAILED DESCRIPTION OF THE PREFERRED EMBODIMENTS

Figure 1:
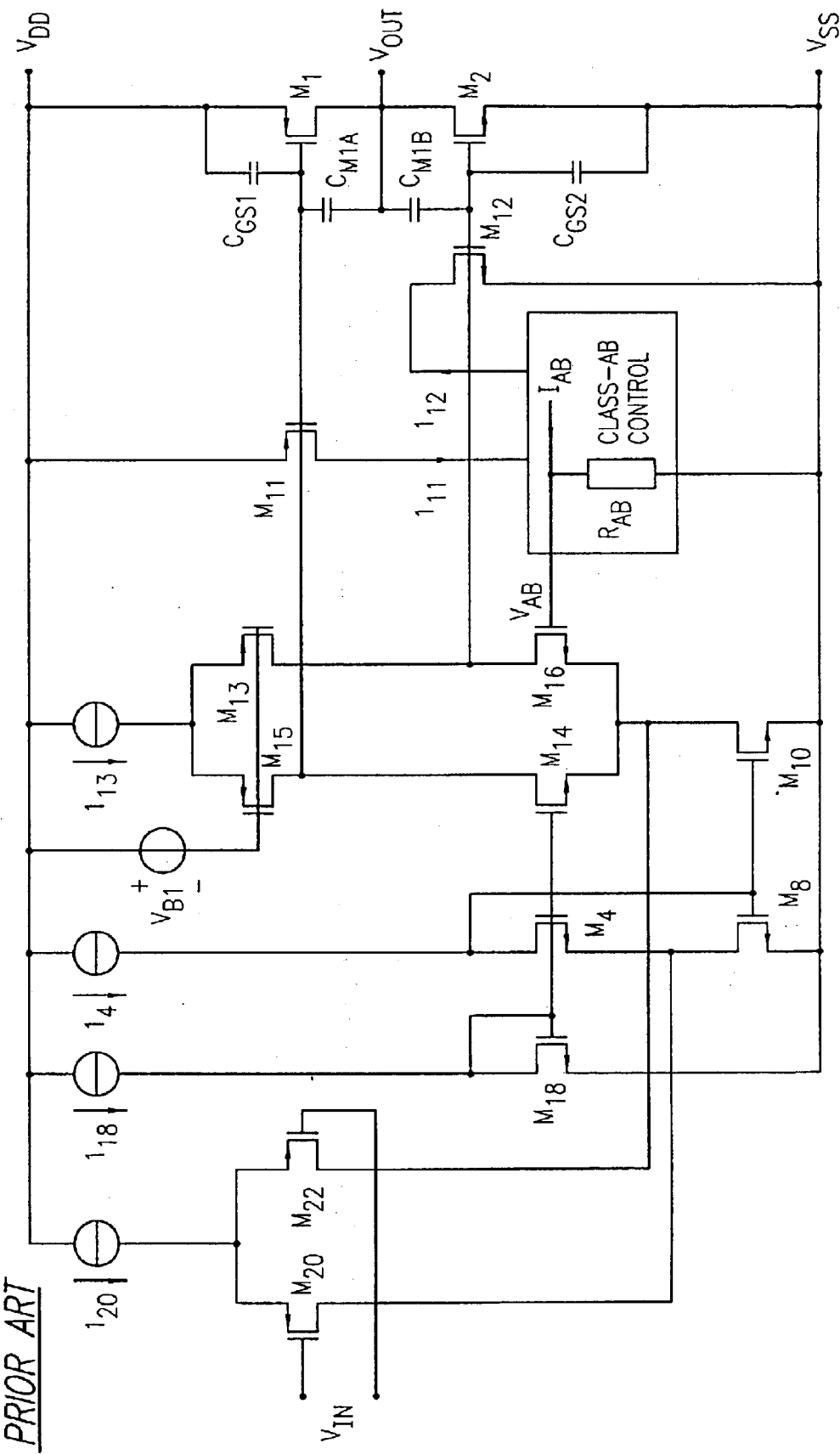
FIG. 1 is a schematic diagram of a prior art low voltage operational amplifier including a class AB output stage with folded mesh circuitry utilized to accomplish class AB control feedback.

In accordance with the present invention, the above-mentioned "systematic error" associated with the folded mesh circuitry of prior art FIG. 1 at high values of VDD needs to be more effectively attenuated, i.e. reduced, by the class AB control feedback loop in order to accomplish adequate control of the quiescent bias current flowing through the class AB output transistors.

The present invention solves problems of the above described prior art by providing split folded cascode circuitry in which transistors on one side (for a single-ended structure) or both sides (for a fully differential structure) of the differential input stage and associated transistors of the folded cascode circuitry are, in effect, "split". The class AB control circuitry feeds output currents into the sources of transistors of the split folded cascode circuitry instead of applying a feedback output voltage to control the gate of a cascode transistor as in the prior art. When the above described prior art folded mesh circuitry is utilized for the cascode transistors, only the main amplifier signal path obtains the high gain benefit usually obtained by use of cascode transistors, whereas the class AB control circuit does not obtain that benefit. The improved configuration using the above mentioned, subsequently described "split" differential input stage transistor structure and associated split cascode transistor structure extends the high gain benefit usually obtained by use of cascode transistors to the main amplifier signals and the class AB control circuit signals and therefore provides an increase in the amount of loop gain achieved by the cascode circuitry and the class AB control circuitry. This increases the amount of attenuation of the systematic error in the drive voltages that are provided to the output transistors of the class AB output stage. A feedback control signal (preferably, a differential feedback control signal) is obtained that more accurately represents the quiescent bias current in the output transistors and greatly increases the accuracy of controlling the quiescent bias current flowing through the class AB output transistors (although a less effective single ended feedback control signal could be used).

Figure 2:
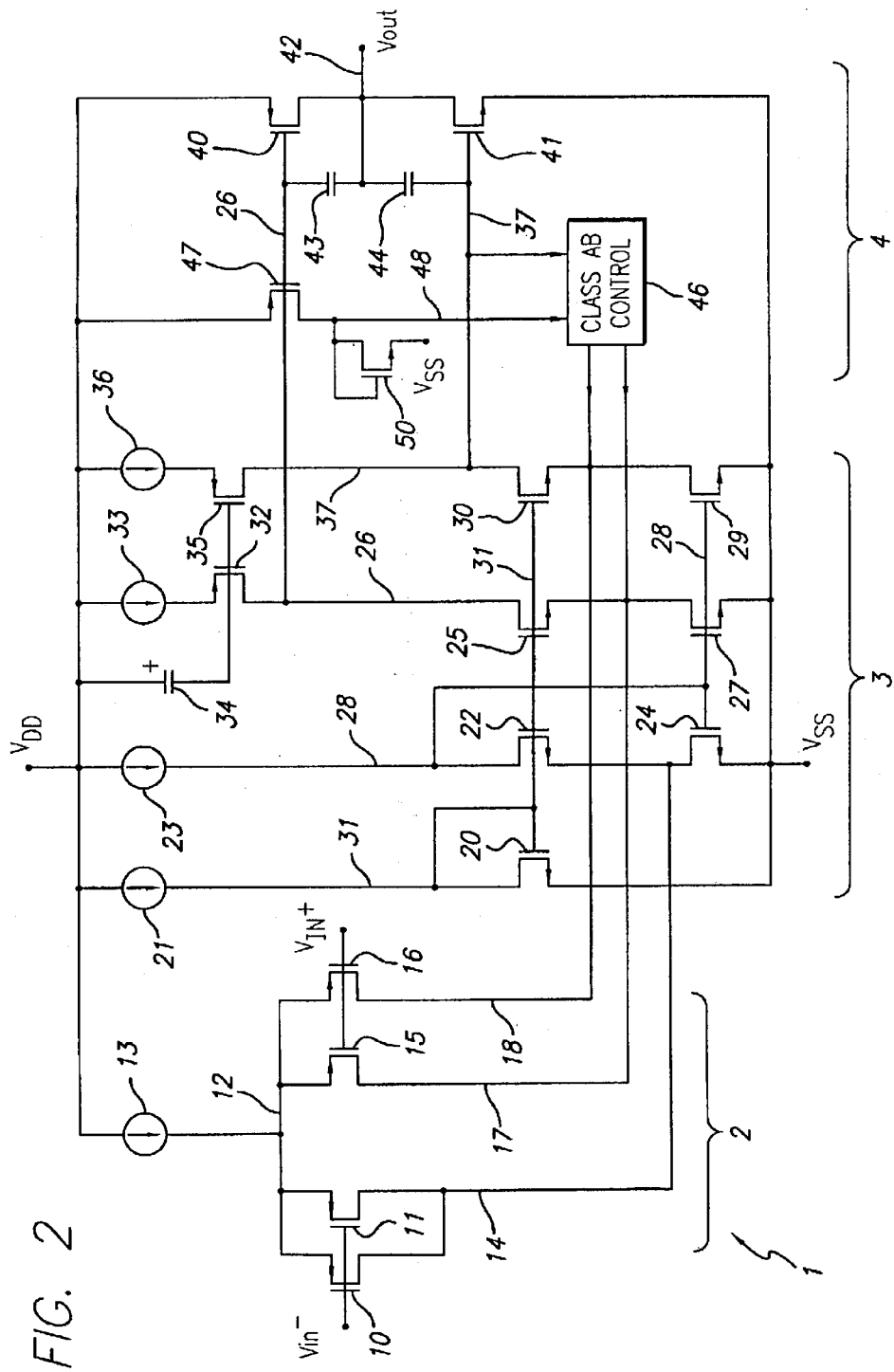
FIG. 2 is a simplified schematic diagram of a single-ended class AB amplifier including a split folded cascode structure in according to the present invention.

Referring to FIG. 2, operational amplifier 1 includes a differential input stage 2, a split folded cascode stage 3, and an improved class AB output stage 4. Input stage 2 includes a constant current source 13 coupled between VDD and a conductor 12 connected to the sources of P-channel input transistors 10, 11, 15, and 16 and constant current source 13. The gates of input transistors 10 and 11 are connected to Vin− and the gates of input transistors 15 and 16 are connected to Vin+. The drain of input transistor 15 is connected to conductor 17 and the drain of input transistor 16 is connected to conductor 18. Ordinarily, input transistors 15 and 16 should have matching geometries. The drains of transistors 10 and 11 are connected to conductor 14. Ordinarily, input transistors 10 and 11 also should have geometries that match the geometry of transistors 15 and 16.

Split folded cascode stage 3 includes a constant current source 21 connected between VDD and a conductor 31, which is connected to the drain and gate of an N-channel diode-connected transistor 20 and to the gates of N-channel cascode transistors 22, 25, and 30. The source of transistor 20 is connected to VSS. The drain of cascode transistor 22 is connected by a conductor 28 to one terminal of a constant current source 23, the other terminal of which is connected to VDD. Conductor 28 also is connected to the gates of N-channel current mirror transistors 24, 27, and 29, the sources of which are connected to VSS. The source of cascode transistor 22 is connected to conductor 14, which is also connected to the drain of current mirror control transistor 24. The source of cascode transistor 25 is connected by conductor 17 to the drain of current mirror output transistor 27. The drain of cascode transistor 25 is connected by a conductor 26 to the drain of a P-channel cascode transistor 32, the source of which is coupled by a constant current source 33 to VDD. The source of cascode transistor 30 is connected by conductor 18 to the drain of current mirror output transistor 29. The drain of cascode transistor 30 is connected by a conductor 37 to the drain of a P-channel cascode transistor 35. The source of transistor 35 is coupled by a constant current source 36 to VDD. The gates of transistors 32 and 35 are connected to the (−) terminal of a voltage source 34, the (+) terminal of which is connected to VDD. The circuitry illustrated as voltage source 34 and current sources 33 and 36 could be implemented by a current mirror circuit similar to the current mirror including transistors 24, 27 and 29 but using P-channel transistors (rather than N-channel transistors) with the sources connected to VDD.

Figure 3:
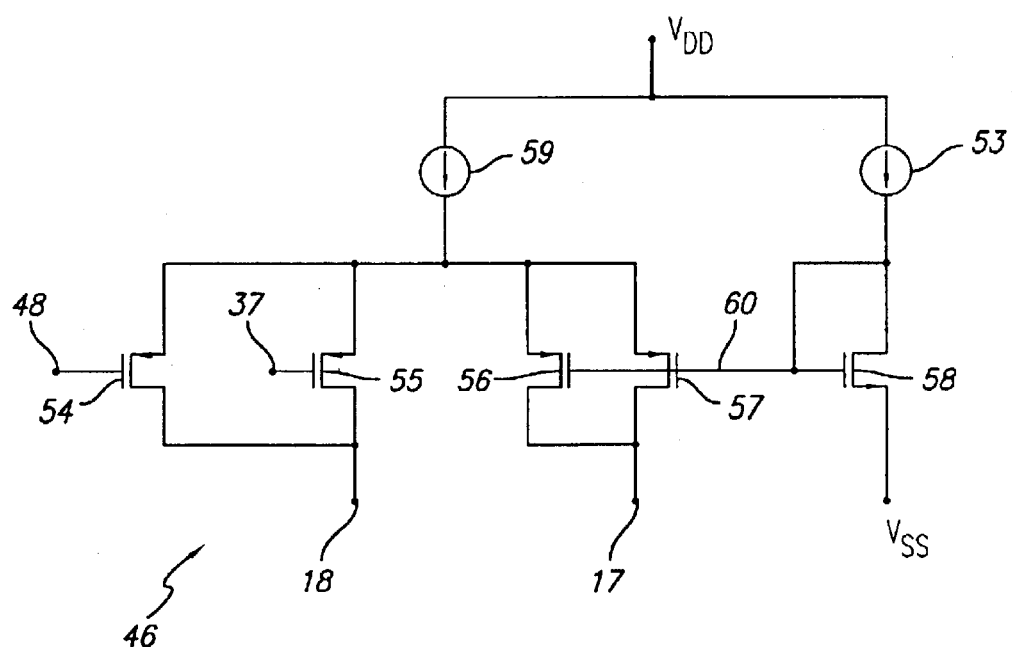
FIG. 3 is a schematic diagram of the class AB control feedback circuitry in the circuit of FIG. 2.

Class AB output stage 4 includes a P-channel pull-up transistor 40 having its source connected to VDD, its gate connected to conductor 26, and its drain connected to an output conductor 42 on which an output voltage Vout is produced. Class AB output stage 4 also includes an N-channel pull-down transistor 41 having its source connected to VSS, its gate connected to conductor 37, and its drain connected to Vout. A class AB control circuit 46 (the details of which are shown in FIG. 3) has a first input connected by a conductor 48 to the drain of a P-channel output current sensing transistor 47, the source of which is connected to VDD. Conductor 48 also is connected to the gate and drain of an N-channel transistor 50, the source of which is connected to VSS.

The gate of output current sensing transistor 47 is connected to conductor 26. A second input of class AB control circuit 46 is connected to conductor 37. A frequency compensation capacitor 43 is coupled between conductors 26 and 42, and another frequency compensation capacitor 44 is connected between conductors 42 and 37. A first output of class AB control circuit 46 is connected by conductor 18 to the source of cascode transistor 30. A second output of class AB control circuit 46 is connected by conductor 17 to the source of cascode transistor 25.

The operation of the circuit shown in FIG. 2 can be understood by explaining the shortcomings of the prior art circuit of FIG. 1 and contrasting the operation of operational amplifier 1 of FIG. 2 with that of prior art FIG. 1. In FIG. 1 the output transistor current sensing transistors M11 and M12 control the class AB control circuit by inputting a current produced in current sensing transistors M11 and M12 in order to determine much quiescent bias current is in output transistors M1 and M2. The class AB control circuit generates a control voltage that controls the gate of cascode transistor M16 of the folded mesh circuit. The signals sensed by the class AB control circuit of prior art FIG. 1 are the differential signals that are applied by the folded mesh circuit to the gates of the output transistors M1 and M2 and vary in the opposite direction as the quiescent current is controlled by the feedback loop.

Unfortunately, the output impedance increases that are normally achieved by using cascode circuitry is not achieved in the folded mesh circuitry of prior art FIG. 1 because of AC currents that "shoot through" the common source connection of transistors M14 and M16 and also through the common source connection of transistors M15 and M13. Consequently, the output impedance for the differential signals in the in the folded mesh circuitry of prior art FIG. 1 is relatively low, and therefore results in reduced class AB control loop gain. Furthermore, in order to obtain improved speed and stability of the feedback loop, the folded mesh transistors M13–16 ordinarily would be designed with very short-channel lengths. However, the very short channel lengths result in further reduction of the output impedances of the cascode transistors in the cascode stage of prior art FIG. 1.

In accordance with the present invention, the foregoing limitations of the circuit of prior art FIG. 1 are avoided by, in effect, "splitting" branches of the prior art circuit so as to decouple the sources of the folded mesh transistors M14 and M16 and the sources of folded mesh transistors M13 and M15. The transistor M10 of prior art FIG. 1 is replaced by separate transistors 27 and 29 in the circuit of FIG. 2. Input transistor M22 of prior art FIG. 1 is replaced by two input transistors 15 and 16 in the improved circuit of FIG. 2 and their drains are connected to the sources of cascode transistors 25 and 30, respectively, which also function as differential input points for the differential output produced by class AB control circuit 46. Current source I13 in the circuit of FIG. 1 is replaced by separate current sources 33 and 36 in FIG. 2. The sources of transistors 32 and 35 in FIG. 2 are not connected, in contrast to folded mesh transistors M15 and M13 in prior art FIG. 1, and the sources of transistors 25 and 30 in FIG. 2 are not connected, in contrast to folded mesh transistors M14 and M16 of prior art FIG. 1.

The above-mentioned AC shoot-through currents of prior art FIG. 1 are avoided in the improved circuit of FIG. 2, and the high output impedances normally obtained by use of cascode circuits are also achieved in the split folded cascode circuit of FIG. 2. Specifically, the high output impedance needed from cascode transistors 25 and 30 and 32 and 35 is achieved. This advantage is accomplished without adding additional transistors in cascode stage 3. The feedback loop gain and the control of the quiescent bias current in output transistors 40 and 41 achieved by class AB control circuit 46 are substantially increased over that of the circuit of prior art FIG. 1. One difference, in terms of the class AB control, is that there is no longer the ability to control the gate of a cascode transistor, because in accordance with the present invention, the sources are decoupled, and controlling the gate of a cascode transistor would be very ineffective. Class AB control feedback is preferably provided in the form of differential currents injected into the decoupled sources of the cascode transistors.

To understand why the common-source-coupled cascode transistors of the prior art folded mesh structure result in lowering the class AB loop gain, it may be helpful to realize that the common source node can be considered to be a virtual ground, the voltage of which does not change significantly in the presence of a differential signal applied to the gates of the two source-coupled cascode transistors 25 and 30. Consequently, the high impedance of the drains of the cascode transistors in the folded mesh configuration for the main differential signals passing from the input to the output amplifier is not present for class AB loop signals applied to gates of the cascode transistors connected in the common source configuration.

In contrast, the new split folded cascode structure shown in FIG. 2 avoids anything resembling a virtual ground in the class AB feedback loop and therefore the benefit of high drain impedance of the cascode transistors is achieved not only for the main amplifier signal path, but also for the class AB control loop signal path. In the circuit of FIG. 2, cascode transistors 25 and 30 function somewhat like a common gate differential amplifier to provide full amplification of the main amplifier signal on conductors 14 and 17 and the differential class AB signal applied via conductors 14 and 17 between the two cascode transistor source electrodes.

There are various ways of providing a suitable implementation of class AB control circuit 46. The class AB output circuit shown in FIG. 3 is a modification of the one disclosed on page 267 of the article "A CMOS Large-Swing Low-Distortion 3-Stage Class AB Power Amplifier" by Frank N. L. Op't Eynde et al., IEEE Journal of Solid-State Circuits, volume 25, No. 1, February 1990.

Referring to FIG. 3, class AB control circuit 46 includes a differential input stage including P-channel transistors 54, 55, 56 and 57 and also includes a reference voltage generating circuit including reference current source 53 and N-channel transistor 58. The sources of input transistors 54, 55, 56 and 57 are connected to one terminal of a constant current source 59, the other terminal of which is connected to VDD. The gates of transistors 54 and 55 are connected to conductors 48 and 37, respectively, of FIG. 2. The gates of transistors 56 and 57 are connected by conductor 60 to the gate and drain of diode-connected transistor 58 and one terminal of reference current source 53, the other terminal of which is connected to VDD. The drains of transistors 54 and 55 are connected to conductor 18 of FIG. 2, and the drains of transistors 56 and 57 are connected to conductor 17 of FIG. 2. The source of transistor 58 is connected to VSS.

Thus, class AB control circuit 46 is basically a differential amplifier having three inputs, one of such inputs 60 receiving a voltage generated from a reference current 53 and diode-connected transistor 58, with the other two inputs 37 and 48 in effect sensing the quiescent output current in output transistors 40 and 41 in FIG. 2. The configuration of transistors 47 and 50 produces a voltage on conductor 48 that represents the current through pull-up transistor 40, and the voltage and conductor 37 represents the current flowing in pulldown output transistor 41. The reference voltage produced on conductor 60 is developed by having the reference current 53 flowing through the diode-connected transistor 58. The voltage on conductor 60 representing the reference current 53 is compared to the voltages on conductors 48 and 37 representing the pull-up transistor current and pull-down transistor current in a ratiometric manner, and the result is utilized by the feedback loop to set the quiescent bias current of pull-up transistor 40 and pull-down transistor 41. The voltages on conductors 48 and 37 are compared with a reference voltage produced on conductor 60 by the circuitry including reference current source 53 and transistor 58, which, in effect, provides a comparison of the bias current in pull-up transistor 40 and pull-down transistor 41 with the reference current 53. (It should be understood that FIG. 3 shows the differential circuit constructed of P-channel transistors 54–57, but an entirely analogous class AB control circuit could be readily implemented using N-type channel input transistors with their sources coupled by a constant current source to VSS, with the outputs connected to the sources of the upper cascode transistors 32 and 35 instead of the lower cascode transistors 25 and 30.) The differential output currents produced in conductors 18 and 17 are injected directly into the source conductors 17 and 18 of cascode transistors 25 and 30, respectively, in contrast to the circuit shown in prior art FIG. 1 in which a output voltage of the class AB control circuit is applied to the gate of a cascode transistor.

With class AB control circuit 46 of FIG. 3 connected to the split folded cascode circuit 3 as shown in FIG. 2, the quiescent output bias current in output transistors 40 and 41 can be readily controlled as a design parameter by appropriately selecting the ratio of channel-length-to-channel-width current sensing transistor 47 to that of pull-up transistor 40 (similarly to the prior art circuit of FIG. 1) and also selecting the relative values of the channel-length-to-channel-width ratios of diode-connected transistors 50 (FIG. 2) and 58 (FIG. 3) and the value of reference current source 53. Note that the quiescent output bias current in pull-tip transistor 40 and pull-down transistor 41 is not affected by the value of constant current source 21, as is the case in the prior art circuit of FIG. 1. (In the split folded cascode circuit of FIG. 2, constant current source 21 only sets up a bias point for the gates of cascode transistors 22, 25 and 30.)

Figures 1, 4:
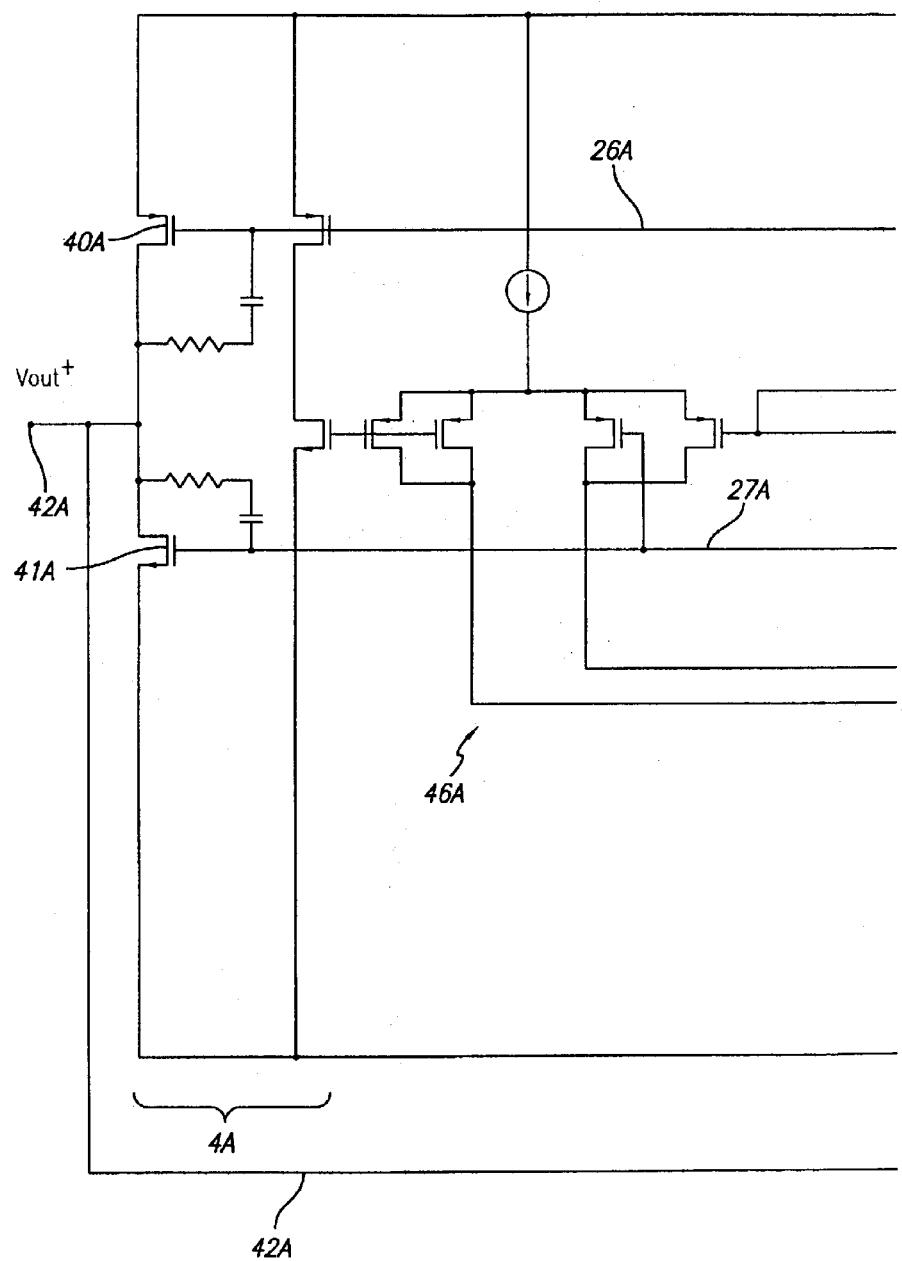
FIG. 4 is a simplified schematic diagram of a fully differential operational amplifier including class AB output stage circuitry and the split folded cascode circuitry of the present invention.
Figures 2, 4:
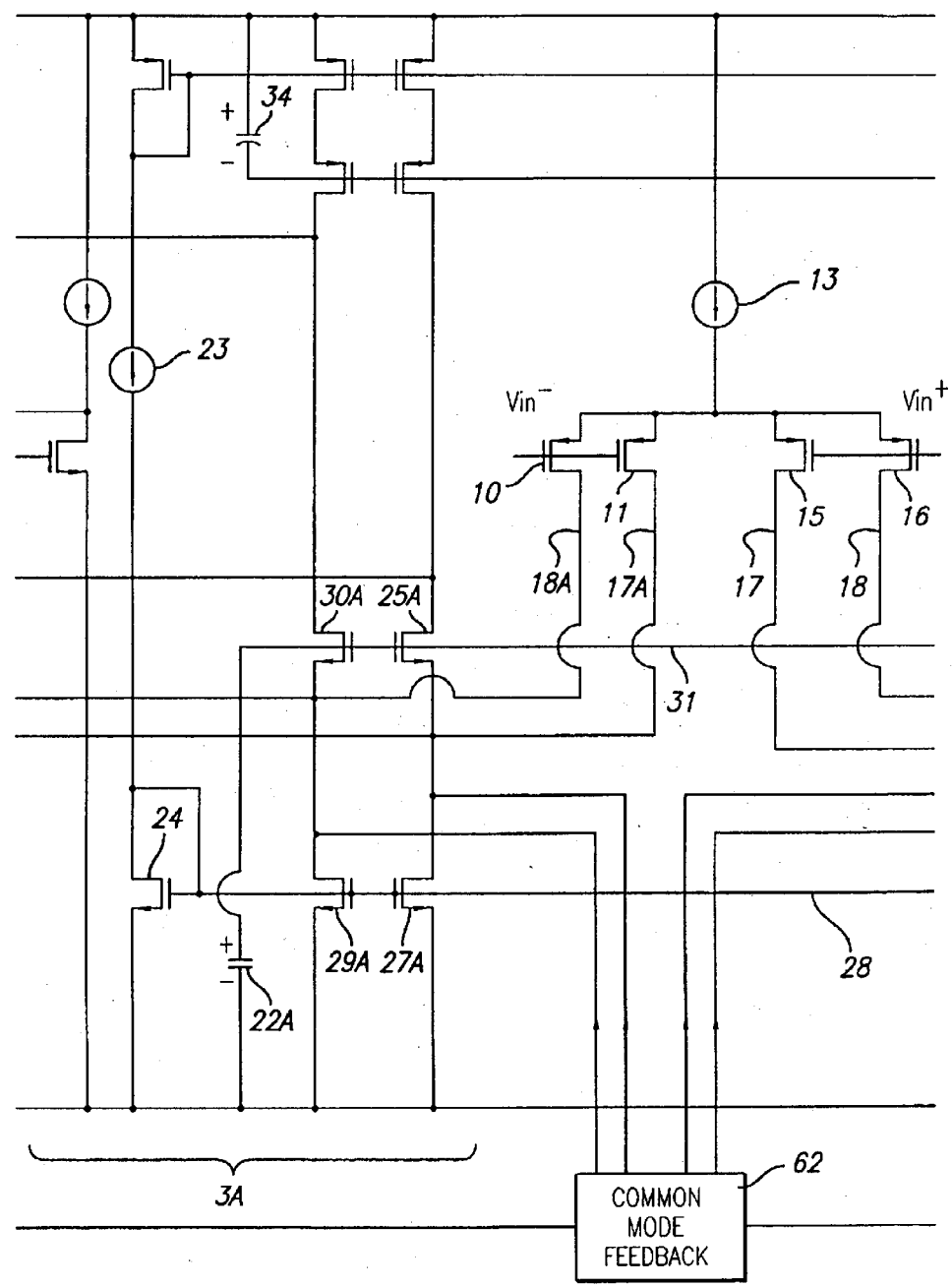
Figures 3, 4:
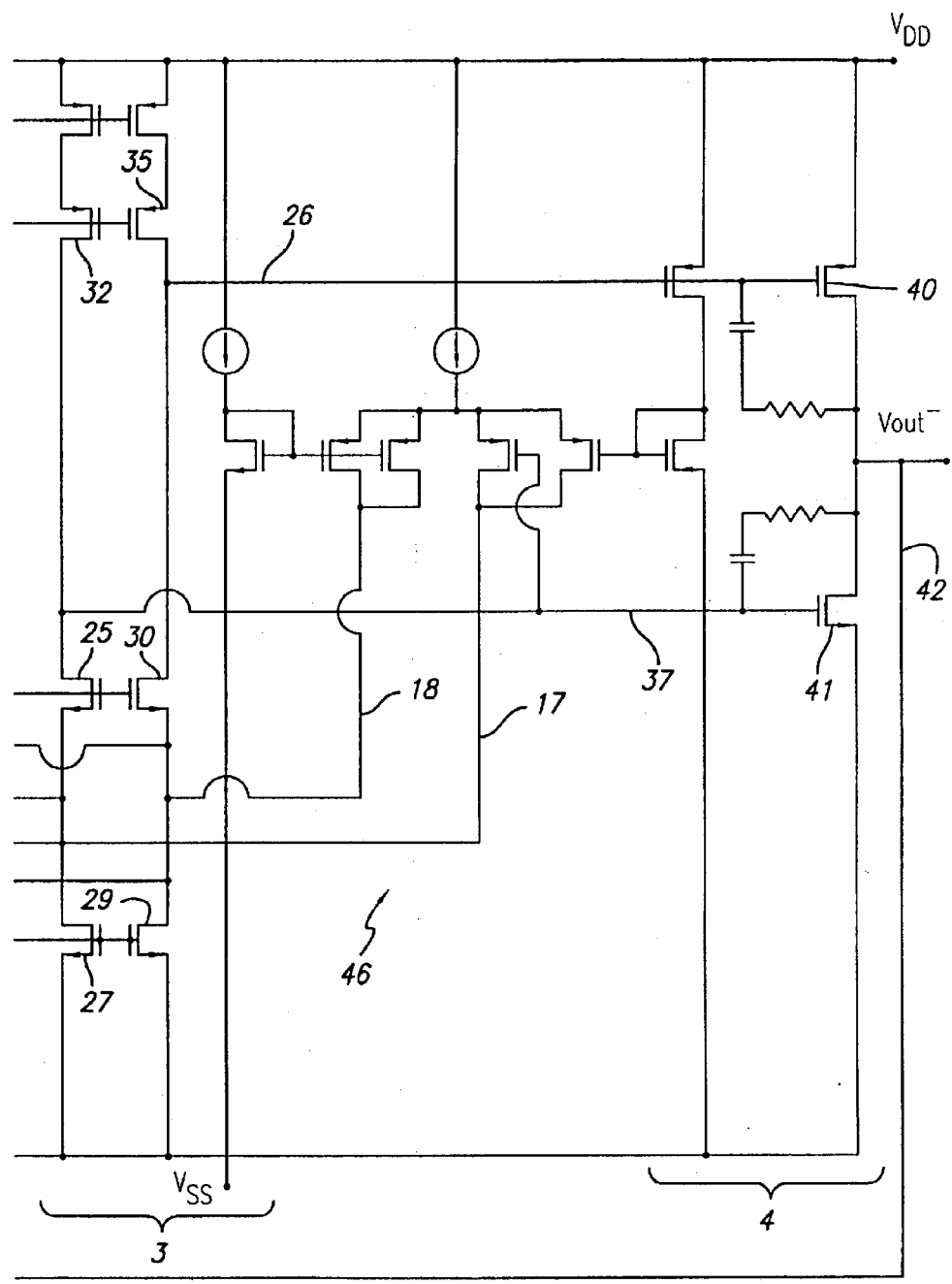

FIG. 4 illustrates a fully differential embodiment of the same invention shown in FIG. 2, with a conventional "continuous-time" (rather than a switched capacitor) type of common mode feedback circuit 60 to that injects a common mode feedback output current into the sources of cascode transistors 25 and 30 and 25A. and 30A in response to Vout– on conductor 42 and Vout+ on conductor 42A. The average of two output voltages Vout− and Vout+ is compared with half of the power supply voltage so the common mode feedback circuit 62 forces the two output voltages to have a common mode component equal to half of the power supply voltage, so as to optimize the AC output voltage range. The drains of input transistors 10 and 11 are connected to conductors 18A and 17A, respectively, instead of to conductor 14 in the single-ended embodiment of FIG. 2, and a mirror image 3A of the split folded cascode circuitry 3 in FIG. 4 is connected to conductors 17A and 18A. The reference numerals of the various elements in the left mirror image portion are the same as the corresponding elements in the right portion of FIG. 4, followed by an "A". A voltage source 22A provides the cascode bias voltage on conductor 31. For a fully differential structure, two similar or identical folded cascode circuits are "interleaved" to provide a practical implementation wherein a typical single ended folded cascode structure is "split" into two identical structures: hence the name "split folded cascode". The current mirror control transistor 24 produces the voltage on conductor 28 in response to the current through current source 23. The conductors 31 and 28 are connected in the same manner to split folded cascode circuitry 3 and 3A. Transistors 27, 27A, 29 and 29A in FIG. 4 are current source transistors rather than current mirror output transistors. A mirror image 46A of the class AB control circuit 46 is coupled to split folded cascode circuitry 3A, and a mirror image 4A of the output stage 4 is connected to split folded cascode circuitry 3A and class AB control circuitry 46A.

To summarize, the output impedance of the class AB loop is much higher than in the prior art because the cascode transistors provide the increased impedance not only for the main amplifier signal path, but also for the class AB feedback loop signal path. Therefore, a higher class AB loop gain is achieved as a result of the higher output impedances at the drains of the cascode transistors. With higher class AB loop gain, improved control of the quiescent output bias current is achieved. By providing the folded-cascode input stage split into two branches, access is provided two parallel folded-cascode nodes for the class AB control loop, which provides improved control of the output current without additional cost. The improved circuitry including the split folded cascode structure accomplishes the foregoing advantage by providing high output impedances for all four of the cascode transistors in order to increase the class AB control loop gain, thereby achieving accurate control of the quiescent bias current of the pull-up and pull-down transistors. The output bias current also is much less sensitive than the prior art to power supply variations, including VDD values in the range between the 2 and 5 volts, as a result of the high loop gain.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

Although class AB control circuit 46 introduces a differential feedback current into the sources of cascode transistors 25 and 30, a single ended feedback current could be introduced into the source of only one of cascode transistors 25 and 30, with a reference current source providing a constant current input to the source of the other cascode transistor. More complex cascode circuit structures, such as a so-called "triple cascode" structure, could be utilized in which two, rather than one, cascode transistors are "stacked" on each current mirror transistor 27 and 29 in FIG. 2. Conventional "regulated" or "gain boosted" cascode circuit structures can be readily used in conjunction with the present invention. Some of the diode-connected transistors, such as transistors 50 and 58, can be implemented by means of ordinary resistors.

What is claimed is:

1. A class AB amplifier comprising:
   (a) a differential input stage including first and second input transistors each having a gate coupled to a first input and a third input transistor having a gate coupled to a second input, sources of the first, second, and third input transistors being coupled to a current source, drains of the first, second, and third input transistors being coupled to first, second and third conductors;
   (b) a first class AB output stage including a first output transistor having a gate coupled to a first gate drive conductor and a drain coupled to a first output conductor and a second output transistor having a gate coupled to a second gate drive conductor and a drain coupled to the first output conductor;
   (c) a first split folded cascode stage including
      i. first and second cascode transistors each having a gate coupled to a reference signal conductor, the first and second cascode transistors having drains coupled to the first and second gate drive conductors, respectively, and sources coupled to the first and second conductors, respectively;
      ii. a first current source transistor coupled between the source of the first cascode transistor and a first reference voltage conductor, and a second current source transistor coupled between the source of the second cascode transistor and the first reference voltage conductor; and
   (d) first class AB control circuitry including a first input coupled to receive a signal representative of a current in the first output transistor, a second input coupled to receive a signal representative of a current in the second output transistor, and a first output coupled to the first conductor,
   wherein the drains of the first and second cascode transistors present high output impedances to the first and second gate drive conductors resulting in high loop gain and consequently resulting in precise control of a first quiescent bias current in the first and second output transistors.

2. The class AB amplifier of claim 1 including third and forth cascode transistors each having a gate coupled to another reference signal conductor, the third and fourth cascode transistors having drains coupled to the first and second gate drive conductors, respectively, and sources coupled to first and second current source devices, respectively, the conductivity type of the third and fourth cascode transistors being opposite to the conductivity type of the first and second cascode transistors.

3. The class AB amplifier of claim 1 wherein the first class AB control circuitry includes a second output coupled to the second conductor.

4. The class AB amplifier of claim 3 including current mirror circuitry including a first current mirror control transistor, the first and second current source transistors being connected as first and second current mirror output transistors, respectively, gates of the current mirror control transistor and the first and second current source transistors being connected together, a drain of the current mirror control transistor being coupled to the third conductor, drains of the first and second current source transistors being coupled to the first and second conductors, respectively.

5. The class AB amplifier of claim 4 wherein the first, second and third input transistors, and the first output transistor are P-channel transistors.

6. The class AB amplifier of claim 4 wherein the second output transistor, the first and second cascode transistors, the first and second current source transistors, and the first current mirror control transistor are N-channel transistors.

7. The class AB amplifier of claim 4 wherein the first, second and third input transistors, and the first output transistor are P-channel transistors, and wherein the second output transistor, the first and second cascode transistors, the first and second current source transistors, and the first current mirror control transistor are N-channel transistors.

8. The class AB amplifier of claim 3 including a current sensing transistor having a source and gate connected to the source and gate, respectively, of the first output transistor and a drain connected to a drain of a diode-connected transistor having a source connected to the first reference voltage conductor and a gate and a drain connected to the first input of the class AB control circuitry to produce the signal representative of the current in the first output transistor.

9. The class AB amplifier of claim 8 wherein the second input of the first class AB control circuitry is connected to the gate of the second output transistor.

10. The class AB amplifier of claim 9 wherein the first class AB control circuitry includes differential amplifying circuitry including first, second and third source-coupled transistors, a reference current source, and a diode-connected reference voltage transistor having a drain connected to receive a reference current from the reference current source, the first and second inputs of the first class AB control circuitry being connected to gates of the first and second source-coupled transistors, respectively, a gate of the third source-coupled transistor being coupled to a gate of the diode-connected reference voltage transistor, a drain of the third source-coupled transistor being coupled to the first conductor, and drains of the first and second source-coupled transistors being coupled to the first conductor.

11. The class AB amplifier of claim 4 including a fourth input transistor having a source, a gate, and a drain connected to the source, gate, and a drain, respectively, of the third input transistor.

12. The class AB amplifier of claim 11 wherein the reference signal conductor conducts a reference signal produced by a DC reference circuit including a reference current source providing a reference current through a diode-coupled transistor having a source coupled to the first reference voltage conductor.

13. The class AB amplifier of claim 11 wherein the first current mirror circuitry includes a second current mirror control transistor having a drain connected to a reference current source and the gates of the first current source transistor and the first and second current source transistors, and a source connected to the third conductor.

14. The class AB amplifier of claim 3 including
a fourth input transistor having a source and gate connected to the source and gate, respectively, of the third input transistor and a drain connected to a fourth conductor;
a second class AB output stage including a third output transistor having a gate coupled to a third gate drive conductor and a drain coupled to a second output conductor and a fourth output transistor having a gate coupled to a fourth gate drive conductor and a drain coupled to the second output conductor;
a second split folded cascode stage including
  i. third and fourth cascode transistors each having a gate coupled to the reference signal conductor, the third and fourth cascode transistors having drains coupled to the third and fourth gate drive conductors, respectively, and sources coupled to the third and fourth conductors, respectively,
  ii. a third current source transistor coupled between the source of the third cascode transistor and the first reference voltage conductor, and a fourth current source transistor coupled between the source of the fourth cascode transistor and the first reference voltage conductor; and
second class AB control circuitry including a first input coupled to receive a signal representative of a current in the third output transistor, a second input coupled to receive a signal representative of a current in the fourth output transistor, a first output coupled to the third conductor, and a second output coupled to the fourth conductor,
wherein the drains of the third and fourth cascode transistors present high output impedances to the third and fourth gate drive conductors resulting in high loop gain and consequently resulting in precise control of a quiescent bias current in the third and fourth output transistors.

15. The class AB amplifier of claim 14 wherein the first, second, third and fourth input transistors, and the first and third output transistors are P-channel transistors.

16. The class AB amplifier of claim 14 wherein the second and fourth output transistors, the first, second, third and fourth cascode transistors, the first, second, third and fourth current source transistors, and the first current mirror control transistor are N-channel transistors.

17. The class AB amplifier of claim 14 wherein the first, second, third and fourth input transistors, and the first and third output transistors are P-channel transistors, and wherein the second and fourth output transistors, the first, second, third and fourth cascode transistors, the first, second, third and fourth current source transistors, and the first current mirror control transistor are N-channel transistors.

18. The class AB amplifier of claim 14 including a common mode feedback circuit having a first input connected to the first output conductor, first and second outputs connected to the first and second conductors, respectively, to establish a common mode component on the first output conductor, a second input connected to the second output conductor, and third and fourth outputs connected to the third and fourth conductors, respectively, to establish the common mode component on the second output conductor.

19. A method of accurately controlling quiescent bias current in a class AB output stage of an amplifier, comprising:
(a) providing the first class AB output stage with a pull-up transistor having a gate coupled to a first gate drive conductor and a drain coupled to a first output conductor and also providing a pull-down transistor having a gate coupled to a second gate drive conductor and a drain coupled to the first output conductor;
(b) providing a split input transistor circuit structure for a first side of a differential input stage by providing first and second input transistors each having a gate coupled to a first input of the amplifier, and also providing a third input transistor having a gate coupled to a second input of the amplifier;

(c) providing a split folded cascode circuit structure having a common gate configuration by providing first and second gate-coupled cascode transistors having drains coupled to the first and second gate drive conductors, respectively, and coupling sources of the first and second gate-coupled cascode transistors to drains of the first and second input transistors, respectively;

(d) providing a third cascode transistor having a gate connected to the reference signal conductor and coupling a source of the third cascode transistor to a drain of the third input transistor by means of a third conductor; and (e) sensing current in the pull-up and pull-down transistors, comparing the sensed current with a predetermined reference current to produce an error signal representing a difference between the sensed current and the predetermined reference current, amplifying the error signal to produce an error current signal, and introducing the error current signal into a source of one of the first and second gate-coupled cascode transistors.

20. A method of accurately controlling quiescent bias current in a pull-up transistor and a pull-down transistor of a class AB output stage of an amplifier, comprising:

(a) providing a first class AB output stage including the pull-up transistor with a gate coupled to a first gate drive conductor and a drain coupled to a first output conductor and the pull-down transistor with a gate coupled to a second gate drive conductor and a drain coupled to the first output conductor, and (b) providing substantially equal amounts of differential amplification to both an output of a differential input stage of the amplifier and an output of a class AB control circuit of the amplifier by
  i. providing a split input transistor circuit structure for a first side of the differential input stage by providing first and second input transistors each having a gate coupled to a first input of the amplifier, and also providing a third input transistor having a gate coupled to a second input of the amplifier,
  ii. providing a split folded cascode circuit structure having a common gate configuration by providing first and second cascode transistors each having a gate coupled to a reference signal conductor, the first and second cascode transistors having drains coupled to the first and second gate drive conductors, respectively,
  iii. providing a third cascode transistor having a gate connected to the reference signal conductor and a source coupled to a drain of the third input transistor,
  iv. coupling drains of the first, second, and third input transistors to the sources of the first, second and third cascode transistors, and
  v. sensing current in the pull-up and pull-down transistors, comparing the sensed current with a predetermined reference current to produce a differential error signal representing a difference between the sensed current and the predetermined reference current, amplifying the differential error signal to produce a differential error current signal, and introducing the differential error current signal into the sources of the first and second cascode transistors.

21. Circuitry for accurately controlling quiescent bias current in a class AB output stage of an amplifier, comprising:

(a) a pull-up transistor in the first class AB output stage having a gate coupled to a first gate drive conductor and a drain coupled to a first output conductor and a pull-down transistor in the first class AB output stage having a gate coupled to a second gate drive conductor and a drain coupled to the first output conductor;

(b) means for providing a split input transistor circuit structure for a first side of a differential input stage including first and second input transistors each having a gate coupled to a first input of the amplifier, and also including a third input transistor having a gate coupled to a second input of the amplifier, sources of the first, second, and third input transistors being coupled to a current source;

(c) means for providing a split folded cascode circuit structure having a common gate configuration including first and second gate-coupled cascode transistors having drains coupled to the first and second gate drive conductors, respectively, sources of the first and second gate-coupled cascode transistors being coupled to drains of the first and second input transistors, respectively;

(d) a third cascode transistor having a gate connected to the reference signal conductor, a source of the third cascode transistor being coupled to a drain of the third input transistor by means of a third conductor; and (e) means for sensing current in the pull-up and pull-down transistors, means for comparing the sensed current with a predetermined reference current to produce an error signal representing a difference between the sensed current and the predetermined reference current, means for amplifying the error signal to produce an error current signal, and means for introducing the error current signal into a source of one of the first and second gate-coupled cascode transistors.

* * * * *